United States Patent [19]

Kumamoto

[11] Patent Number: 4,695,748
[45] Date of Patent: Sep. 22, 1987

[54] COMPARING DEVICE

[75] Inventor: Toshio Kumamoto, Itami, Japan

[73] Assignee: Mitsubishi Denki Kabushiki Kaisha, Tokyo, Japan

[21] Appl. No.: 900,442

[22] Filed: Aug. 26, 1986

[30] Foreign Application Priority Data

Aug. 27, 1985 [JP] Japan ................................ 60-190737

[51] Int. Cl.$^4$ .............................................. H03K 5/24
[52] U.S. Cl. ...................................... 307/355; 307/362
[58] Field of Search ........................ 307/355, 356, 362

[56] References Cited

U.S. PATENT DOCUMENTS

| | | | |
|---|---|---|---|
| 3,676,702 | 7/1972 | McGrogan, Jr. .................... | 307/355 |
| 4,461,965 | 7/1984 | Chin ..................................... | 307/355 |
| 4,547,683 | 10/1985 | Bingham .............................. | 307/356 |

OTHER PUBLICATIONS

Dingwall, Andrew G., "Monolithic Expandable 6 Bit 20 MHz CMOS/SOS A/D Converter", *IEEE Journal of Solid State Circuits*, vol. Sc-14, No. 6, Dec. 1979, pp. 926-932.

*Primary Examiner*—John Zazworsky
*Attorney, Agent, or Firm*—Lowe Price LaBlanc Becker & Shur

[57] ABSTRACT

A comparing device comprises a first CMOS inverter (6) for detecting a difference between a voltage to be compared (Vin) and a reference voltage (Vref), a second CMOS inverter (9) connected directly to the first CMOS inverter (6) and a third CMOS inverter (11) connected directly to the second CMOS inverter (9), the input of the first CMOS inverter (6) and the output of the third CMOS inverter (11) being connected through a transmission gate (22). The current-driven capacity of the first CMOS inverter (6) is selected to be larger than that of the second inverter (9) and that of the third inverter (11) so that the difference between the voltage to be compared (Vin) and the reference voltage (Vref) can be detected precisely at high speed. The second inverter (9) and the third inverter (11) have a desired voltage amplifying function so that the voltage difference detected by the first inverter (6) can be amplified by these two inverters (9 and 11) and either of the binary outputs can be obtained at an output terminal (12).

3 Claims, 7 Drawing Figures

COMPARING DEVICE

BACKGROUND OF THE INVENTION

1. Field of the Invention

The present invention relates to a comparing device and particularly to a chopper-type comparator which can operate with high resolution and at high speed, the number of components thereof being decreased.

2. Description of the Prior Art

FIG. 6 is a diagram showing an example of a structure of a conventional chopper-type comparator. First of all, the structure of this chopper-type comparator will be described. In FIG. 6, an input terminal 1 is connected to a coupling capacitor 5 through a transmission gate 3 and an input terminal 2 is connected to the coupling capacitor 5 through a transmission gate 4. A voltage to be compared Vin is applied to the input terminal 1 and a reference voltage Vref is applied to the input terminal 2. The reference numerals 14 and 15 indicate gate terminals of the transmission gate 3 and the reference numerals 16 and 17 indicate gate terminals of the transmission gate 4. Clock signals $\phi$ and $\bar{\phi}$ and clock signals $\bar{\phi}$ and $\phi$ set respectively in a non-overlapping manner are applied to the gate terminals 14 and 15 and the gate terminals 16 and 17, respectively. These clock signals $\phi$ and $\bar{\phi}$ serve to control the transmission gates 3 and 4 so that the transmission gate 3 and the transmission gate 4 are turned on and off complementarily. The coupling capacitor 5 is connected to a CMOS inverter 6 as well as to a transmission gate 7. N1 is a node among the coupling capacitor 5, the CMOS inverter 6 and the transmission gate 7. The CMOS inverter 6 comprises a p-channel MOS field effect transistor (hereinafter referred to as the p-channel MOS FET) 61 and an n-channel MOS field effect transistor (hereinafter referred to as the n-channel MOS FET) 62. One electrode of the p-channel MOS FET 61 is connected to a power supply terminal 13 of voltage $V_{DD}$ and the other electrode thereof is connected to one electrode of the n-channel MOS FET 62. The other electrode of the n-channel MOS FET 62 is grounded. The reference numerals 18 and 19 indicate gate terminals of the transmission gate 7 and clock signals $\bar{\phi}$ and $\phi$ are applied to these gate terminals. The transmission gate 7 is controlled by these clock signals $\bar{\phi}$ and $\phi$ so that the transmission gate 7 is turned on and off in a manner complementary to the transmission gate 3. The output of the CMOS inverter 6 and the output of the transmission gate 7 are both connected to one electrode of a coupling capacitor 8. The other electrode of the coupling capacitor 8 is connected to the input of a CMOS inverter 9 as well as to the input of a transmission gate 10. N2 is a node among the coupling capacitor 8, the CMOS inverter 9 and the transmission gate 10. The CMOS inverter 9 comprises a p-channel MOS FET 91 and an n-channel MOS FET 92. One electrode of the p-channel MOS FET 91 is connected to the power supply terminal 13 at voltage $V_{DD}$ and the other electrode thereof is connected to one electrode of the n-channel MOS FET 92. The other electrode of the n-channel MOS FET 92 is grounded. The reference numerals 20 and 21 indicate gate terminals of a transmission gate 10, clock signals $\bar{\phi}$ and $\phi$ being applied to these gate terminals 20 and 21 respectively. The transmission gate 10 is controlled by these clock signals $\bar{\phi}$ and $\phi$ so that the transmission gate 10 is turned on and off in a manner complementary to the transmission gate 3. The output of the CMOS inverter 9 and the output of the transmission gate 10 are both connected to a CMOS inverter 11. The CMOS inverter 11 comprises a p-channel MOS FET 111 and an n-channel MOS FET 112. One electrode of the p-channel MOS FET 111 is connected to the power supply terminal 13 at the voltage $V_{DD}$ and the other electrode thereof is connected to one electrode of the n-channel MOS FET 112. The other electrode of the n-channel MOS FET 112 is grounded. The CMOS inverter 11 is connected to an output terminal 12. The voltage at the output terminal 12 of the CMOS inverter 11 is Vout.

FIG. 7 is a graph showing characteristics of the CMOS inverters 6, 9 and 11 in FIG. 6, the horizontal axis representing input voltage and the vertical axis representing output voltage. As shown by the characteristic curve $\alpha$, the CMOS inverters 6, 9 and 11 have the common characteristics. Taking the CMOS inverter 6 as an example, when the input voltage is 0, the p-channel MOS FET 61 is in the ON state and the n-channel MOS FET 62 is in the OFF state and accordingly the output voltage of the CMOS inverter 6 is $V_{DD}$. When the input voltage is $V_{DD}$, the p-channel MOS FET 61 is in the OFF state and the n-channel MOS FET 62 is in the ON state and accordingly the output voltage of the CMOS inverter 6 is 0. It is the same with the CMOS inverters 9 and 11. When the transmission gates 7 and 10 are in the ON state, the outputs of the CMOS inverters 6 and 9 are connected to the respective inputs thereof and consequently the input voltage of the CMOS inverters 6 and 9 is equal to the output voltage thereof. In other words, the respective CMOS inverters 6 and 9 are in a balanced state at a point b' of intersection between the line extending from the origin 0 at an angle of 45° with respect to the horizontal axis and the characteristic curve, and thus, the input voltage and the output voltage both become Vbal.

Now, the operation of the above described chopper-type comparator will be described. When the clock signal $\phi$ is at the level H, the transmission gates 7 and 10 are in the ON state and the voltages at the nodes N1 and N2 are both Vbal as shown in FIG. 7. In that period, the transmission gate 4 is in the ON state and voltages Vref and Vbal are applied to the respective ends of the coupling capacitor 5. The voltage Vbal of the CMOS inverter 6 and the voltage Vbal of the CMOS inverter 9 are applied to the respective two ends of the coupling capacitor 8. In the period when the clock signal $\phi$ is at the level L, only the transmission gate 3 is in the ON state and the voltage to be compared Vin is applied to the left electrode of the coupling capacitor 5, and accordingly the potential at the node N1 changes from Vbal by an amount of (Vin−Vref) if the stray capacitance or the like is not taken into account. As is clear from FIG. 7, a minor change in the input voltage causes a relatively large change in the output voltage in the vicinity of the intersection point b' and this change in the output voltage affects the CMOS inverter 9 through the coupling capacitor 8 and as a result the output voltage thereof is changed considerably from Vbal. The change amount is further increased by the CMOS inverter 11 in the following manner:

$$V_{out} \approx \begin{cases} V_{DD} & V_{in} < V_{ref} \\ 0 & V_{in} > V_{ref} \end{cases} \quad (1)$$

and as a result the circuit shown in FIG. 6 operates as a comparator.

Thus, in the conventional CMOS chopper-type comparator as described above, the respective input and output of the CMOS inverters 6 and 9 are connected by the transmission gates 7 and 10 and for the purpose of enhancing resolution, the CMOS inverter 6, the input and the output of which are connected by the transmission gate 7, is provided and connected to the CMOS inverter 9 through the coupling capacitor 8, the input and the output of the CMOS inverter 9 being connected by the transmission gate 10. In such a manner, the number of components is necessarily increased and the use of the coupling capacitor 8 involves a disadvantage that a change in the voltage of the CMOS inverter 6 having the input and the output connected by the transmission gate 7 cannot be efficiently transmitted to the CMOS inverter 9 having the input and the output connected by transmission gate 10.

SUMMARY OF THE INVENTION

The present invention has been accomplished for the purposed of solving the above described problems.

Therefore, it is an object of the present invention to provide a chopper-type comparator which can operate with high resolution and at high speed, and in which the number of components is decreased.

A chopper-type comparator in accordance with the present invention is structured in the following manner. A first input terminal to which a voltage to be compared is applied is connected to the input of first switching means and a second input terminal to which a reference voltage is applied is connected to the input of second switching means. The output of the first switching means and the output of the second switching means are connected to one electrode of a coupling capacitor. The other electrode of the coupling capacitor is connected to the input of a first inverter. The output of the first inverter is connected to the input of a second inverter. The output of the second inverter is connected to the input of a third inverter. The input of the first inverter and the output of the third inverter are connected through third switching means. The first inverter has a voltage difference detecting function for detecting a difference between the voltage at the first input terminal and the voltage at the second input terminal; the second inverter has a voltage difference amplifying function for amplifying the output of the first inverter; and the third inverter has a voltage difference amplifying function for amplifying the output of the second inverter.

Thus, the first inverter has a voltage difference detecting function and the second and third inverters each have a voltage difference amplifying function, and there is not provided a coupling capacitor between the first inverter and the second inverter. Therefore, with such structure, a high resolution can be obtained and operation can be performed at high speed. In addition, the number of components forming a circuit can be decreased and a simple configuration of a circuit can be realized.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
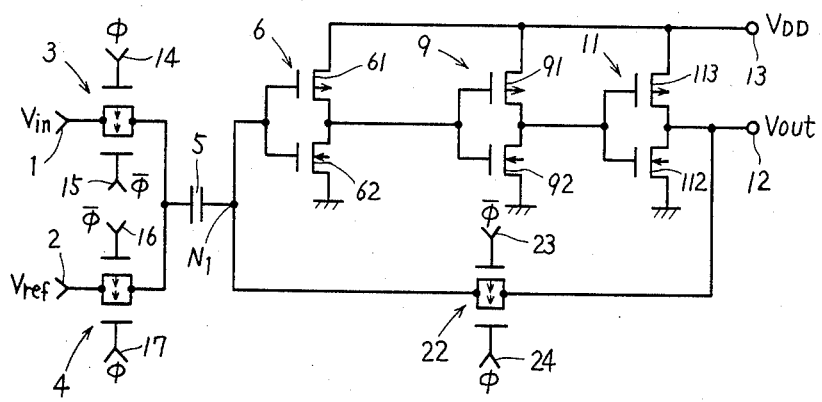
FIG. 1 is a diagram showing a construction of a chopper-type comparator of an embodiment of the present invention.

FIG. 1 is a diagram showing a construction of a chopper-type comparator in accordance with an embodiment of the present invention.

Referring to FIG. 1, a voltage to be compared Vin is applied to an input terminal 1 and a reference voltage Vref is applied to an input terminal 2. The reference numerals 14 and 15 indicate gate terminals of a transmission gate 3 and the reference numerals 16 and 17 indicate gate terminals of a transmission gate 4. Clock signals $\bar{\phi}$ and $\phi$ and clock signals $\bar{\phi}$ and $\phi$ set respectively in a non-overlapping manner are applied to the gate terminals 14 and 15 and the gate terminals 16 and 17, respectively. These clock signals $\bar{\phi}$ and $\phi$ control turning on and off of the transmission gates 3 and 4. Thus, the transmission gates 3 and 4 are turned on and off in a complementary manner.

One electrode of a coupling capacitor 5 is connected to the input of a CMOS inverter 6. The output of the CMOS inverter 6 is connected directly to the input of a CMOS inverter 9. The output of the CMOS inverter 9 is connected directly to the input of a CMOS inverter 11. The output of the CMOS inverter 11 and the input of the CMOS inverter 6 are connected through a transmission gate 22. Such construction as described above is one of the features of this embodiment.

The CMOS inverter 6 comprises a p-channel MOS FET 61 and an n-channel MOS FET 62 for example, one electrode of the p-channel MOS FET 61 being connected to the power supply terminal 13 at the voltage $V_{DD}$, the other electrode thereof being connected to one electrode of the n-channel MOS FET 62 and the other electrode of the n-channel MOS FET 62 being grounded. Similarly, the CMOS inverter 9 comprises a p-channel MOS FET 91 and an n-channel MOS FET 92 for example and the CMOS inverter 11 comprises a p-channel MOS FET 113 and an n-channel MOS FET 112 for example, one electrode of the p-channel MOS FET 91 and one electrode of the p-channel MOS FET 113 being connected to the power supply terminal 13, the respective other electrodes thereof being connected to one electrode of the n-channel MOS FET 92, and one electrode of the n-channel MOS FET 112 and the other electrodes of the n-channel MOS FET's 92 and 112 being grounded.

The transmission gate 22 comprises gate terminals 23 and 24, to which clock signals $\bar{\phi}$ and $\phi$ are applied to control the transmission gate 22 so that it is turned on and off in a manner complementary to the transmission gate 3.

Another feature of this embodiment resides in that the input and output characteristics of the CMOS inverters 6, 9 and 11 are set in the below described manner. More specifically, the input and output characteristics of the CMOS inverter 6 are set so that a change in the input voltage appears as a gradual change in the output voltage as shown by the solid line $\beta$ in FIG. 2. On the other hand, the input and output characteristics of the CMOS inverters 9 and 11 are set so that a minor change in the input voltage may cause a large change in the output voltage as shown by the solid line $\gamma$ in FIG. 3.

By the above described setting of the input and output characteristics of the CMOS inverter 6, 9 and 11, the current-driven capacity of the CMOS inverter 6 is made larger than the current-driven capacities of the CMOS inverters 9 and 11 and the gain of the CMOS inverter 6 is made smaller than the gains of the CMOS inverters 9 and 11. As a result, the CMOS inverter 6 has a function of detecting a voltage difference and the CMOS inverters 9 and 11 have a function of amplifying a voltage difference.

For the purpose of setting the input and output characteristics of the respective CMOS inverters as described above, it is only necessary to make the gate length of each of the MOS FET's 61 and 62 of the CMOS inverter 6 shorter than the gate length of each of the MOS FET's 91 and 92 of the CMOS inverter 9 and the gate length of each of the MOS FET's 113 and 112 of the CMOS inverter 11 if the gate widths of the respective MOS FET's of the CMOS inverters 6, 9 and 11 are all equal.

Figure 3:
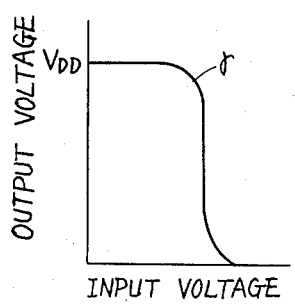
FIG. 3 is a graph showing input and output characteristics of CMOS inverters 9 and 11 in a chopper-type comparator in accordance with the present invention.
Figure 4:
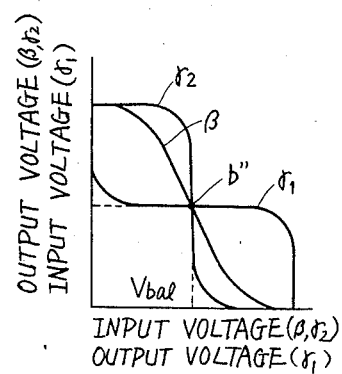
FIG. 4 is a graph showing, in an overlapping manner, the input and output characteristics of the CMOS inverters 6, 9 and 11 in a chopper-type comparator in accordance with the present invention.
Figure 6:
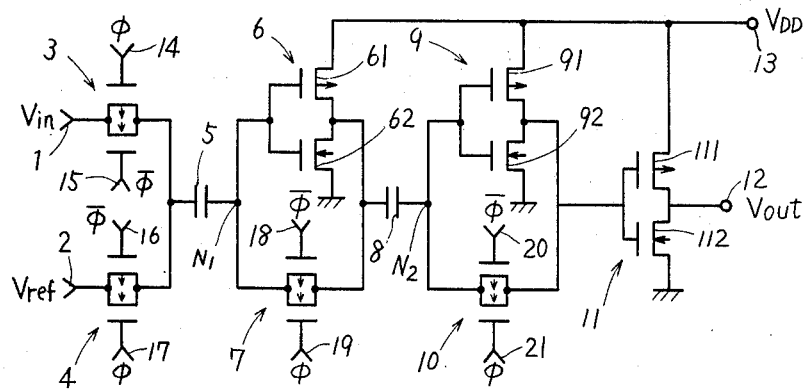
FIG. 6 is a diagram showing a construction of a conventional chopper-type comparator.

Now, the operation of the circuit shown in FIG. 1 will be described. The CMOS inverters 6, 9 and 11 are biased so that they are all operated at a high-gain operating point. The high-gain operating point is a point b" on the characteristic curve shown in FIG. 4. FIG. 4 is a characteristic diagram representing all the input and output characteristic curves of the respective inverters shown in FIGS. 2 and 3. In FIG. 4, the solid line $\beta$ represents the input and output characteristic curve of the CMOS inverter 6; the solid line $\gamma_1$ represents the input and output characteristic curve of the CMOS inverter 9; and the solid line $\gamma_2$ represents the input and output characteristic curve of the CMOS inverter 11. However, since the input and output characteristics of the CMOS inverters 9 and 11 are set to be the same as described above with reference to FIG. 3, those characteristic curves will coincide with each other on the same graph. Therefore, FIG. 4 represents the input and output characteristic curve $\gamma_1$ of the inverter 9 by indicating the input voltage on the vertical axis and the output voltage on the horizontal axis.

If the CMOS inverter 6 is operated in the vicinity of the point b" on the input and output characteristic curves in FIG. 4, the following results can be obtained.

Figure 2:
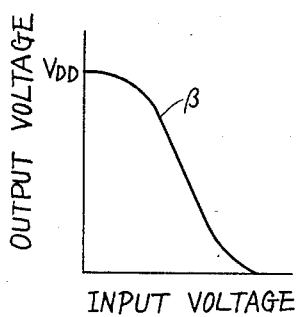
FIG. 2 is a graph showing input and output characteristics of a CMOS inverter 6 in a chopper-type comparator in accordance with the present invention.
Figure 5:
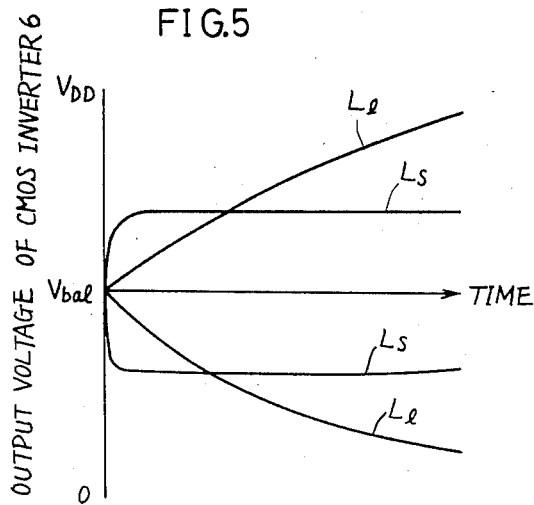
FIG. 5 is a graph showing an output voltage waveform of the CMOS inverter 6 in a chopper-type comparator in accordance with the present invention.
Figure 7:
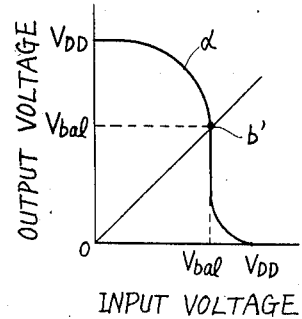
FIG. 7 is a graph showing input and output characteristics of CMOS inverters 6, 9 and 11 in a conventional chopper-type comparator.

Since the input and output characteristic curve of the CMOS inverter 6 shows a large current-driven capacity as can be seen by the solid line $\beta$ in FIG. 2, the output voltage changes sharply to rise or fall as shown by the solid line Ls in FIG. 5. Accordingly, the CMOS inverter 6 has the output voltage characteristics having a small time constant for rise or fall with a small change amount in the output voltage. Thus, a high resolution can be obtained and high-speed operation can be performed. If the gate length of each of the MOS FET's 61 and 62 of the CMOS inverter 6 is increased, the current-driven capacity could be necessarily decreased according to the increase of the gate length. In such a case, the voltage could be changed to a large extent but the time constant at the rise or fall of the output voltage waveform would be increased, resulting in the output characteristics shown by L1 in FIG. 5.

Taking the above described output characteristics of the CMOS inverter 6 into consideration, the operation of the whole of the circuit will be described with reference to FIG. 1. In a period of the level H of the clock signal $\phi$, the transmission gate 22 is in the on state and the voltage at the node N1 is Vbal as shown in FIG. 4. In this period, the transmission gate 4 is also in the on state and the voltages Vref and Vbal are applied to the two ends of the coupling capacitor 5. Then, in the period of the level L of the clock signal $\phi$, only the transmission gate 3 is in the on state and the voltage to be compared Vin is applied to the left electrode of the coupling capacitor 5. Accordingly, the potential at the node N1 is changed by (Vin−Vref) from Vbal if the stray capacitance or the like is disregarded. This change appears immnediately with a certain amplified amount as a change in the output of the CMOS inverter 6 because the CMOS inverter 6 has the above described characteristics enabling a high resolution and high-speed operation.

In consequence, the CMOS inverter 9 for receiving directly the output of the CMOS inverter 6 receives a voltage change amplified to some extent by the CMOS inverter 6 and amplifies the voltage change effectively to supply it to the CMOS inverter 11. The CMOS inverter 11 further amplifies the voltage change (voltage difference).

More specifically, the CMOS inverter 6 at the first stage out of the CMOS inverters connected at three stages is made to have characteristics so that the amplifying function thereof may be limited to the minimum and the voltage difference detecting function may be performed sufficiently. On the contrary, the characteristics of the inverter 6 at the second stage and the inverter 11 at the third stage are set so that they may perform the amplifying function sufficiently.

In the above described embodiment, all the three stages of the CMOS inverters are biased by the transmission gate 22. However, this invention is also applicable to cases in which CMOS inverters are formed by another odd number of stages such as five stages or seven stages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A comparing device for obtaining binary outputs by comparing an input voltage and a reference voltage, comprising:

first switching means having an input terminal supplied with a voltage to be compared and an output terminal, and responsive to clock signals supplied from the exterior for turning on and off between said input terminal and said output terminal, second switching means having an input terminal supplied with said reference voltage and an output terminal, and responsive to clock signals supplied from the exterior for turning on and off between said input terminal and said output terminal.

said first switching means and said second switching means being controlled so that they are turned on and off in a complementary manner, a coupling capacitor having a first electrode and a second electrode, said first electrode of the coupling capacitor being connected to said output terminal of said first switching means and to said output terminal of said second switching means, a first inverter having an input terminal and an output terminal, said input terminal of said first inverter being connected to the second electrode of said coupling capacitor, and said first inverter having a function of detecting a difference between the output voltage of said first switching means and the output voltage of said second switching means, a second inverter having an input terminal and an output terminal, said input terminal of said second inverter being connected directly to the output terminal of said first inverter, and said second inverter having a function of amplifying the output of said first inverter, a third inverter having an input terminal and an output terminal, said input terminal of said third inverter being connected to the output terminal of said second inverter, and said third inverter having a function of amplifying the output of said second inverter, and third switching means having an input terminal connected to the output terminal of said third inverter and an output terminal connected to the input terminal of said first inverter, and responsive to clock signals supplied form the exterior so as to be synchronized with the turning on and off of said second switching means for turning on and off between said input terminal and said output terminal of said third switching means.

2. A comparing device in accordance with claim 1, wherein
the current-driven capacity of said first inverter is made larger than the current-driven capacity of said second inverter and the current-driven capacity of said third inverter.

3. A comparing device in accordance with claim 1, wherein
said first inverter, said second inverter and said third inverter each comprise a complementary MOS inverter including a p type MOS transistor and an n type MOS transistor, the gate widths of the p type MOS transistor and the n type MOS transistor included in each said complementary MOS inverter are all made equal, and the gate length of the p type MOS transistor and the n type MOS transistor of said first inverter is made shorter than the gate length of the p type MOS transistors and the n type MOS transistors of said first and second inverters.

* * * * *